(12) United States Patent
Lin et al.

(10) Patent No.: US 9,935,073 B2
(45) Date of Patent: *Apr. 3, 2018

(54) SEMICONDUCTOR STRUCTURE AND MANUFACTURING METHOD OF THE SAME

(71) Applicant: TAIWAN SEMICONDUCTOR MANUFACTURING COMPANY LTD., Hsinchu (TW)

(72) Inventors: Yen-Liang Lin, Taichung (TW); Mirng-Ji Lii, Hsinchu County (TW); Tin-Hao Kuo, Hsinchu (TW); Chen-Shien Chen, Hsinchu County (TW); Yu-Feng Chen, Hsinchu (TW); Sheng-Yu Wu, Hsinchu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 15/480,883

(22) Filed: Apr. 6, 2017

(65) Prior Publication Data
US 2017/0213804 A1 Jul. 27, 2017

Related U.S. Application Data

(63) Continuation of application No. 14/455,615, filed on Aug. 8, 2014, now Pat. No. 9,633,965.

(51) Int. Cl.
*H01L 23/00* (2006.01)
*H01L 23/498* (2006.01)

(52) U.S. Cl.
CPC ........ *H01L 24/17* (2013.01); *H01L 23/49811* (2013.01); *H01L 23/49827* (2013.01);
(Continued)

(58) Field of Classification Search
CPC ............... H01L 24/17; H01L 23/49827; H01L 23/49838; H01L 21/486; H01L 23/49811;
(Continued)

(56) References Cited

U.S. PATENT DOCUMENTS 9,633,965 B2 * 4/2017 Lin ......................... H01L 24/17
2011/0169150 A1 7/2011 Su et al.
2014/0191391 A1 7/2014 Chuang et al.

FOREIGN PATENT DOCUMENTS

CN 103915401 7/2014

OTHER PUBLICATIONS

First Office Action from Chinese Patent Office dated Aug. 28, 2017 for application No. 201510482229.8.
US20140191391 is the counterpart of CN103915401.

* cited by examiner

*Primary Examiner* — Roy Potter
(74) *Attorney, Agent, or Firm* — WPAT, P.C., Intellectual Property Attorneys; Anthony King

(57) ABSTRACT

The present disclosure provides a semiconductor package, including a semiconductor die and a substrate having a first surface electrically coupled to the semiconductor die and a second surface opposing to the first surface. The first surface includes a core region having a plurality of landing pads and a periphery region surrounding the core region and having a plurality of landing traces. A pitch of the landing pads is from about 55 μm to about 280 μm. The semiconductor die includes a third surface facing the first surface of the substrate and a fourth surface opposing to the third surface. The third surface includes a plurality of elongated bump positioned correspondingly to the landing pads and the landing traces of the substrate, and the elongated bump includes a long axis and a short axis perpendicular to the long axis on a cross section thereof.

20 Claims, 16 Drawing Sheets

(52) U.S. Cl.
CPC ........ *H01L 23/49838* (2013.01); *H01L 24/11* (2013.01); *H01L 2224/16235* (2013.01); *H01L 2224/1705* (2013.01); *H01L 2924/13091* (2013.01); *H01L 2924/3511* (2013.01)

(58) Field of Classification Search
CPC ........... H01L 23/50; H01L 2224/16235; H01L 2224/16237; H01L 2224/16238; H01L 2224/1705; H01L 2924/13091; H01L 2924/15311; H01L 24/11; H01L 2924/3511; H01L 2224/01
See application file for complete search history.

SEMICONDUCTOR STRUCTURE AND MANUFACTURING METHOD OF THE SAME

CROSS REFERENCE OF RELATED APPLICATIONS

This application claims the benefit of prior-filed application Ser. No. 14/455,615, filed Aug. 8, 2014, under 35 U.S.C. 120.

BACKGROUND

As device sizes continue to fall, the pitch between the terminals on the integrated circuits is also decreasing. Bridging between adjacent bumps may cause electrical shorts, for example. Also, the solder bumps are subject to mechanical deformation so that the bump heights in a completed flip chip substrate assembly may be non-uniform and the bumps may, after remelting and reflow processing, end up with unequal distances between them. Further, the use of underfills ("UF") with solder bumps in certain fine pitch devices can leave voids in the UF materials, creating additional problems such as cracking and hot spots, etc.

A solution for finer pitch devices is to use, instead of solder bumps, copper or other conductive pillars with a solder (typically a lead free solder) cap. In addition to copper (Cu), other conductive materials such as nickel (Ni), gold (Au), palladium (Pd) and the like may be used, and alloys of these metals may also be used. These pillars form a connector type referred to as "copper pillar bumps". Copper pillar bumps may also include copper alloys and other copper containing conductors, or the pillar bumps may be formed of other conductive materials. An advantage of these pillar bumps is that the pillars do not completely deform during reflow. While the solder cap forms a spherical tip that does melt during thermal reflow, the columnar pillar tends to maintain its shape. The copper pillars are more conductive thermally than the solder bumps used previously, enhancing heat transfer. The narrow pillars may then be used in a finer pitch array than previously possible with solder bumps, without bridging shorts, and other problems such as non-uniform bump height. As the size of the integrated circuit devices continues to shrink, the pitch between the terminals and the corresponding pitch between pillar bumps will also continue to decrease. The problems associated with the thermal stresses observed using pillar bumps may be expected to increase with continued reduction in the pitch between terminals.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
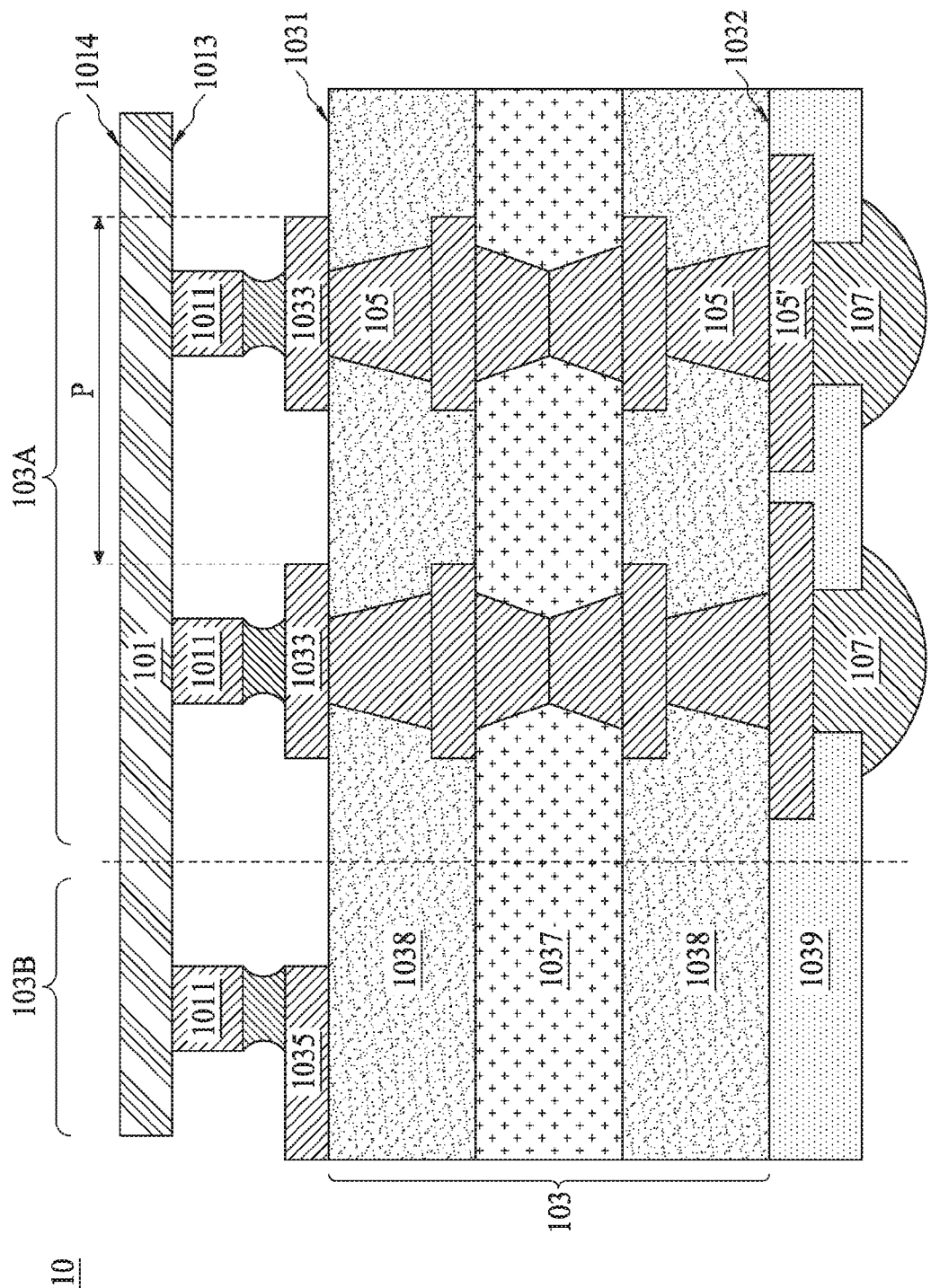
FIG. 1 shows a cross sectional view of a semiconductor package, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Along with the demand of finer pitch in advanced device packaging, conventional bump on pad layout cannot achieve the desired fine pitch due to fundamental layout constraints. For example, the copper bumps or any conductive bumps on a semiconductor die are designed as circular, whereas the conductive traces at the periphery region of a substrate for the semiconductor die are strip patterns where each strip possesses a width narrower than a diameter of the circular bump. In order to accommodate the circular conductive bumps and avoiding the occurrence of bridging, separations between adjacent conductive traces cannot be reduced without taking the size of the circular bump into consideration. For another example, the conductive layout at the core region of a substrate for a semiconductor die is designed to include both conductive traces and conductive pads. The mixed pattern of wiring the conductive traces together with conductive pads (usually with a circular geometry having a wider receiving surface than the conductive traces) inherently constrains the layout and the density of the conductive bump on a semiconductor die.

Conventionally the conductive layout at the core region of a substrate for a semiconductor die is designed to include both conductive traces and conductive pads, or with conductive traces with various widths (hereinafter a "mixed pattern layout"). A wider conductive trace may be served as landing trace, which is to be receiving the conductive bump of a semiconductor die. A narrower conductive trace may be a pass line trace without receiving the conductive bump. Regardless of the geometry of the conductive bump, an I/O count density of the conductive bump on a semiconductor die corresponding to the core region of the substrate is around 1100 ea/9*9 mm$^2$, which does not meet the fine pitch requirement for advanced device packaging. Moreover, under the mixed pattern layout scheme, distance from a landing point of the conductive bump to through hole-connections extending from the die side to a circuit board side is nominally 250 μm. The extended wiring path in the mixed layout pattern scheme may be one of the causes for RC delay problems in an advanced device package.

Present disclosure provides a semiconductor package structure with a design rule that is able to increase the I/O count density of the conductive hump corresponding to the core region of the substrate from about 1100 ea/9*9 mm$^2$ to about 4400 ea/9*9 mm$^2$. The wiring path in some of the embodiments is effectively reduced and therefore better RC delay performance can be expected. The greater I/O count density of the conductive bump is allowed to minimize the impact of CTE mismatch between semiconductor die and substrate. Greater I/O count density may reduce the CTE mismatch stress exerted on each conductive bump.

Referring to FIG. 1, FIG. 1 is a cross sectional view of a semiconductor package 10, in accordance with some embodiments of the present disclosure. For simplicity, only a portion of the semiconductor package 10 is shown in FIG. 1. Semiconductor package 10 includes a semiconductor die 101, a substrate 103 with a first surface 1031 facing the semiconductor die 101 and a second surface 1032 away from the semiconductor die 101. The first surface 1031 includes a core region 103A and a periphery region 103B. As shown in FIG. 1, the first surface 1031 in the core region 103A possesses a plurality of landing pads 1033 (only two are shown), and the first surface 1031 in the periphery region 103B possesses a plurality of landing traces 1035 (only one is shown). Two adjacent landing pads 1033 in the core region 103A have a pitch P of from about 55 μm to about 280 μm. The landing pads described herein are referred to conductive pads with discrete geometry such as a circular pad or a polygonal pad. The landing traces described herein are referred to strip patterns designed for conductive path wiring and conductive bump receiving. In some embodiments, the periphery region 103B may include both landing pads and landing traces. In addition, the semiconductor die 101 includes a third surface 1013 facing the substrate 103 and a fourth surface 1014 away from the substrate 103. A plurality of conductive bumps 1011 are positioned on the third surface 1013 and electrically connected to the landing pads 1033 and landing traces 1035 on the first surface 1031 of the substrate 103. In some embodiments, the third surface 1013 is an active surface of the semiconductor die 101.

In some embodiments, semiconductor die 101 may include various doped regions depending on design requirements as known in the art (e.g., p-type wells or n-type wells). The doped regions are doped with p-type dopants, such as boron or $BF_2$; n-type dopants, such as phosphorus or arsenic; or combinations thereof. The doped regions may be a P-well structure, an N-well structure, a dual-well structure, or a raised structure. The semiconductor die 101 may further include various active regions, such as regions configured for an N-type metal-oxide-semiconductor (NMOS) transistor device and regions configured for a P-type metal-oxide-semiconductor (PHOS) transistor device. The semiconductor die 101 may further include a plurality of isolation features (not shown), such as shallow trench isolation (STI) features or local oxidation of silicon (LOCOS) features. The isolation features may define and isolate the various microelectronic elements. Examples of the various microelectronic elements that may be formed in the semiconductor die 101 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices.

In some embodiments, the substrate 103 may be formed using a core layer 1037 with through-holes that are plated with a conductor such as copper and its alloys, or with other conductive metals and their alloys. The through-holes are then filled with conductive plugs or filler material. Dielectric layers 1038, which may be an additive build up film, epoxy-containing dielectric, or other insulator, is shown covering both sides of the core layer 1037. Multiple level metallization layers 105 form conductive path in the vertical directions. In some embodiments, solder mask 1039 is positioned on both the second surface 1032, surrounding ball lands 105', which are configured to receive an external terminal, such as a solder ball 107, for making the external connectors of the packaged integrated circuit, and on the first surface 1031, surrounding the landing pads 1033 (not shown in FIG. 1).

Figure 2:
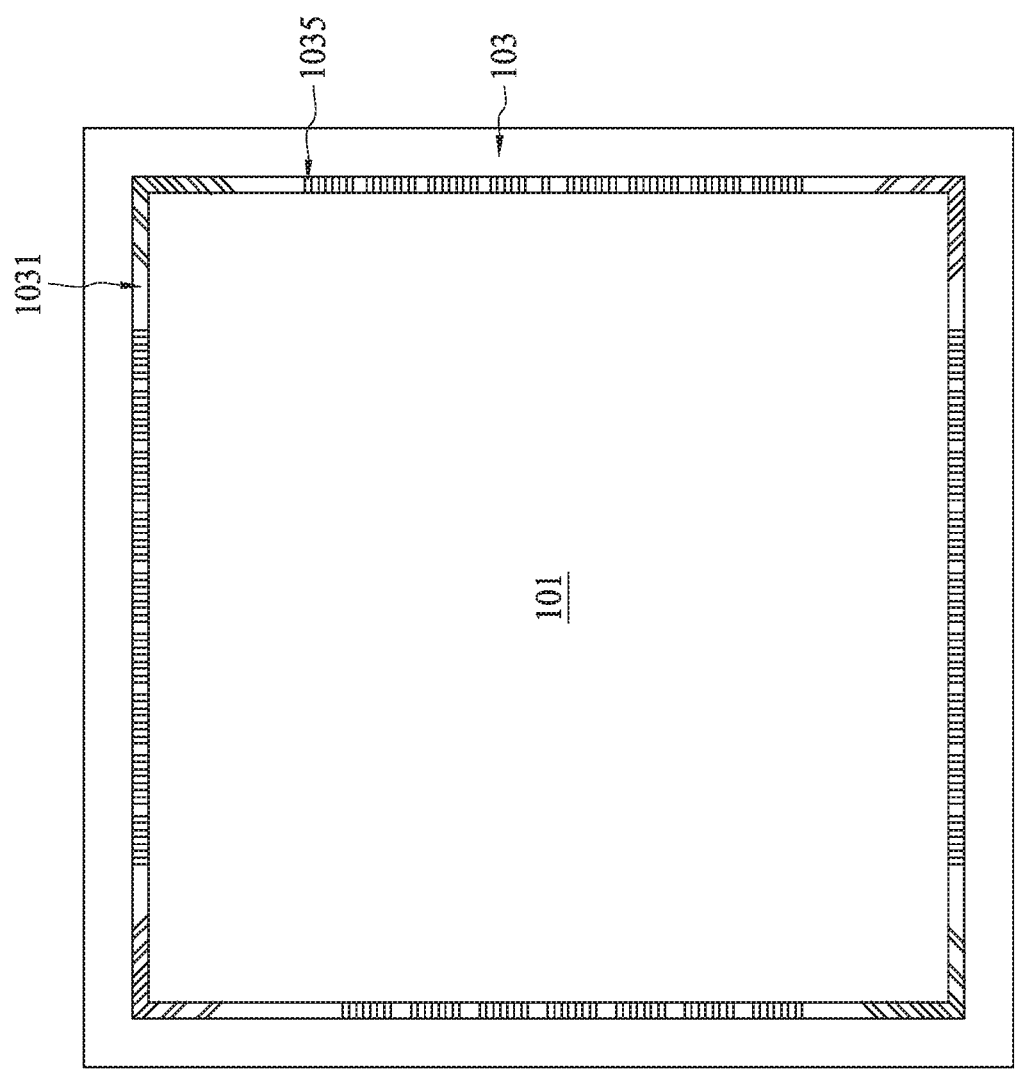
FIG. 2 shows a top view of a semiconductor package, in accordance with some embodiments of the present disclosure.

FIG. 2 shows a top view of a semiconductor package, in accordance with some embodiments of the present disclosure. FIG. 2 shows a semiconductor flip chip package, where the conductive bumps and solder including lead or lead free solder compositions are mounted with the integrated circuit in the semiconductor die 101, facing down to the substrate 103, and a thermal reflow process is used to complete the solder connections. These integrated circuit devices in the semiconductor die 101 may have tens or hundreds of input and output terminals for receiving and sending signals and/or for coupling to power supply connections. In a flip chip package as described in some embodiments of the present disclosure, the substrate 103 may or may not have a core layer 1037 as shown in FIG. 1. Details of the substrate 103 structure are described in FIG. 8 to FIG. 11 of the present disclosure. The dielectric layer in the substrate 103 may be formed of insulating materials including polyimides, organics, inorganics, resins, epoxies and the like.

Figure 3:
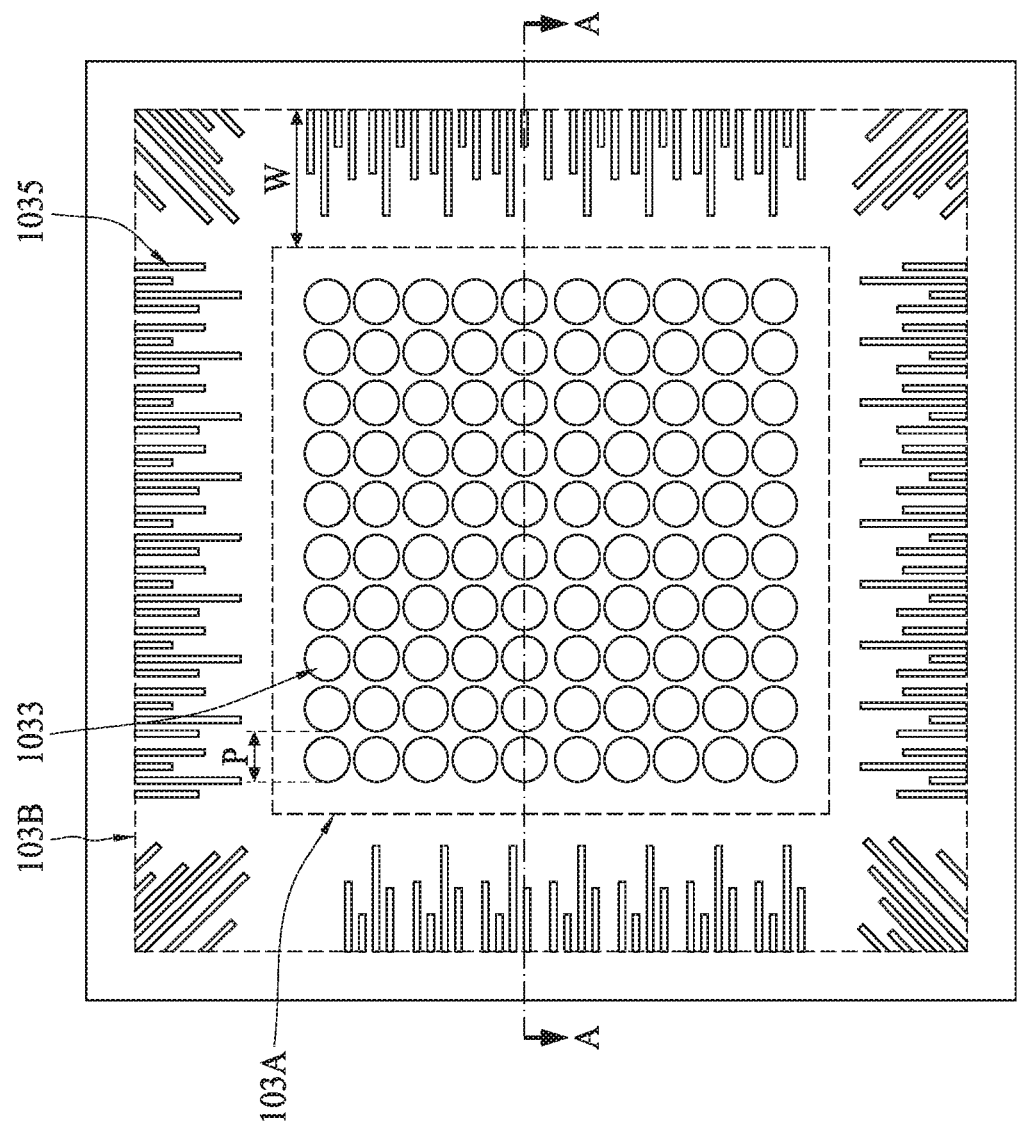
FIG. 3 shows a top view of a substrate of a semiconductor package, in accordance with some embodiments of the present disclosure.

Referring to FIG. 2 and FIG. 3, FIG. 2 shows only a back side of the semiconductor die 101 positioned over the substrate 103. A circumferential portion of the first surface 1031 in the periphery region of the substrate 103 is not covered by the semiconductor die 101, and a fragment of landing traces 1035 thereon can be observed. In FIG. 3, semiconductor die 101 is removed for the purpose of showing the landing pads 1033 and landing traces 1035 layout on the first surface 1031 of the substrate 103. Referring to FIG. 1 and FIG. 3, the core region 103A is surrounded by the periphery region 103B. In some embodiments, the periphery region 103B is defined to have a width W of about 6 times of a minimum pitch P of the landing pads 1033 in the core region 103A. For example, as shown in FIG. 3, a pitch P between adjacent landing pads 1033 is in a range of from about 55 μm to about 280 μm, and the width W of the periphery region 103B is within a range of from about 600 μm to a bout 900 μm.

Figure 4:
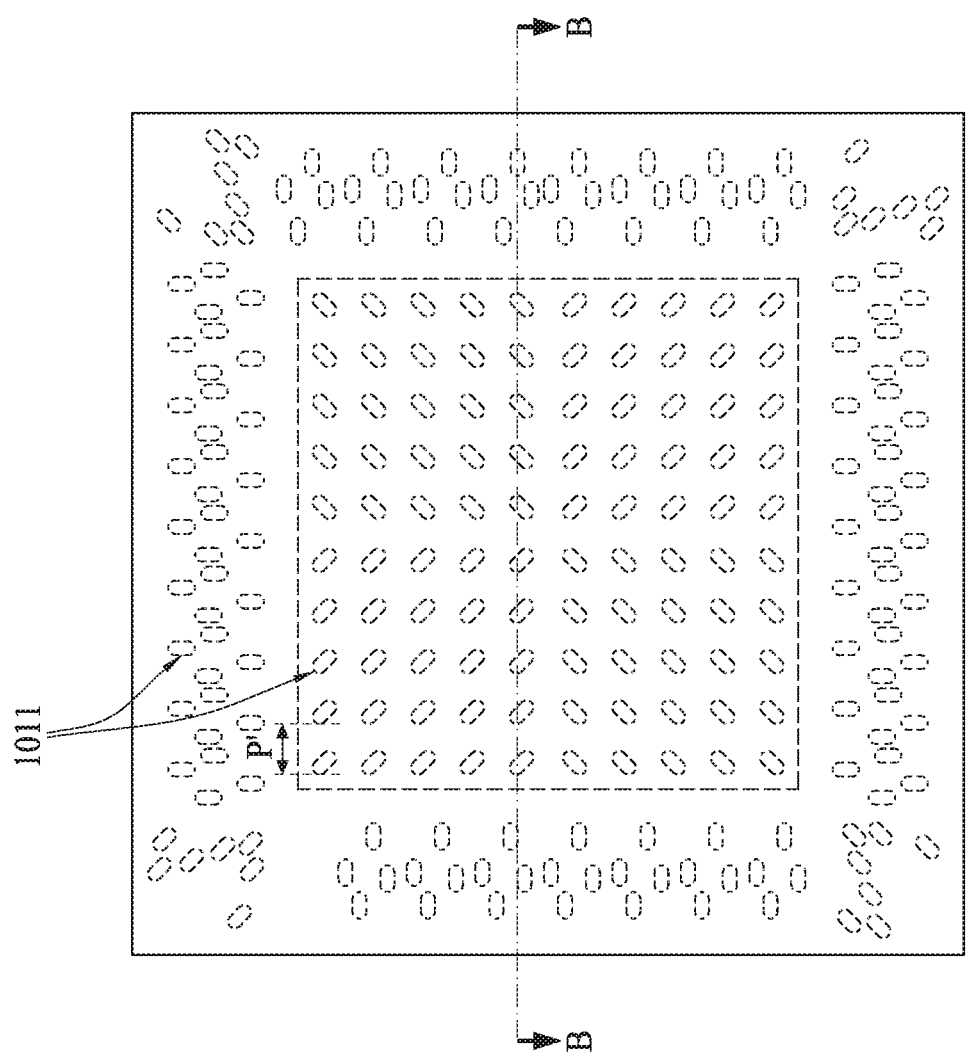
FIG. 4 shows an active surface of a semiconductor die in a semiconductor package, in accordance with some embodiments of the present disclosure.

Referring to FIG. 4, FIG. 4 shows a top view of an active surface of a semiconductor die in a semiconductor package, in accordance with some embodiments of the present disclosure. In FIG. 4, a plurality of conductive bumps 1011 shown in dotted lines are positioned on the third surface 1013, or the active surface, of the semiconductor die 101. In some embodiments, the conductive bumps 1011 in a center portion of the semiconductor die 101 are positioned to correspond to the landing pads 1033 on the first surface 1031 of the substrate 103; the conductive bumps 1011 in a periphery portion of the semiconductor die 101 are positioned to correspond to the landing traces 1035 on the first surface 1031 of the substrate 103. Note the conductive bumps 1011 possess an elongated shape instead of a conventional circular shape. The elongated shape of the conductive bump is further discussed in FIG. 6A and FIG. 7A. In the present disclosure, the conductive bumps 1011 are named as elongated bumps 1011. The elongated bumps 1011 possess a short axis narrower than the circular bump counterpart, and hence the layout of the landing trace 1035 and the landing bump 1033 can be designed to have greater pattern density. As shown in FIG. 4, a pitch P' of the elongated humps 1011 corresponding to the core region of the first surface 1031 (hereinafter the "corresponding core region") is in a range of from about 55 μm to about 280 μm, and in some embodiments, the elongated bumps 1011 in the corresponding core region demonstrate an I/O count density of from about 4000 ea/9*9 mm$^2$ to about 4500 ea/9*9 mm$^2$. Because only discrete patterns instead of mixed pattern (i.e. including discrete pattern and wiring pattern) are formed in the core region 103A on the first surface 1031, the elongated hump 1011 hump density may have a fourfold increase.

Figure 5:
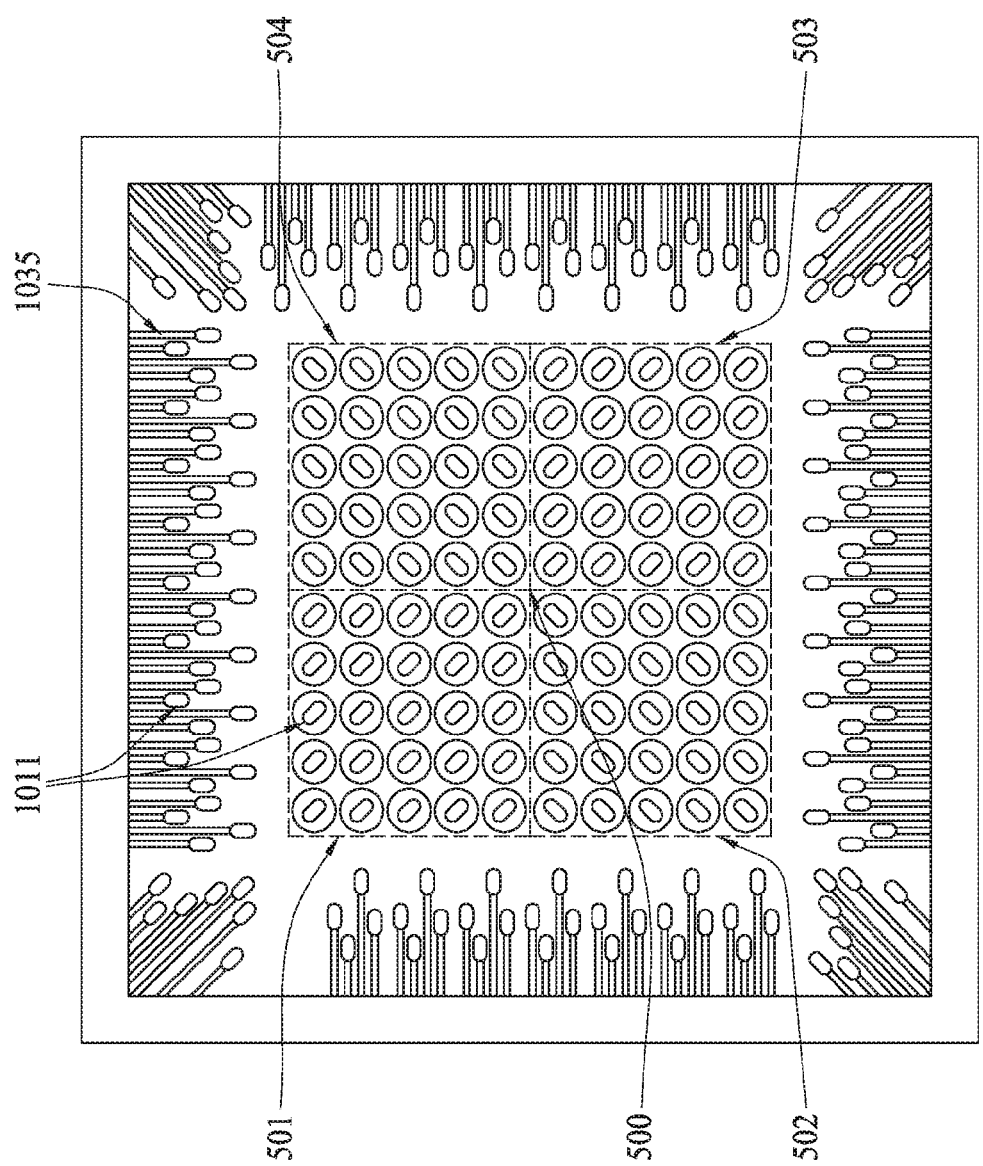
FIG. 5 shows a top view of landing pads, bump traces on a substrate and corresponding positions of elongated bumps on a semiconductor die, in accordance with some embodiments of the present disclosure.

Referring to FIG. 5, FIG. 5 shows a superposition of FIG. 3, the landing pads 1033 and landing traces 1035 on the first surface 1031, and FIG. 4, the elongated bumps 1011 positioned corresponding to the conductive patterns on the first surface 1031. In FIG. 5, the elongated bumps 1011 in the corresponding core region are arranged with the long axes thereof aligning to different direction. In other word, the long axes of the elongated bumps 1011 are directed to different directions. In some embodiments as shown in FIG. 5, the long axes of the elongated humps 1011 are arranged to point to a radial direction with respect to an origin 500 of the elongated bumps 1011 pattern. For simplicity purpose, regions 501 and 503 may possess elongated bumps 1011 with same directions; regions 502 and 503 may possess elongated bumps 1011 with same directions. However, the arrangement of the elongated bumps 1011 is not limited to the embodiment shown in FIG. 5, other arrangement which can facilitate the even distribution the bonding stress imposed on the semiconductor die are within the contemplated scope of the present disclosure.

Figure 6B:
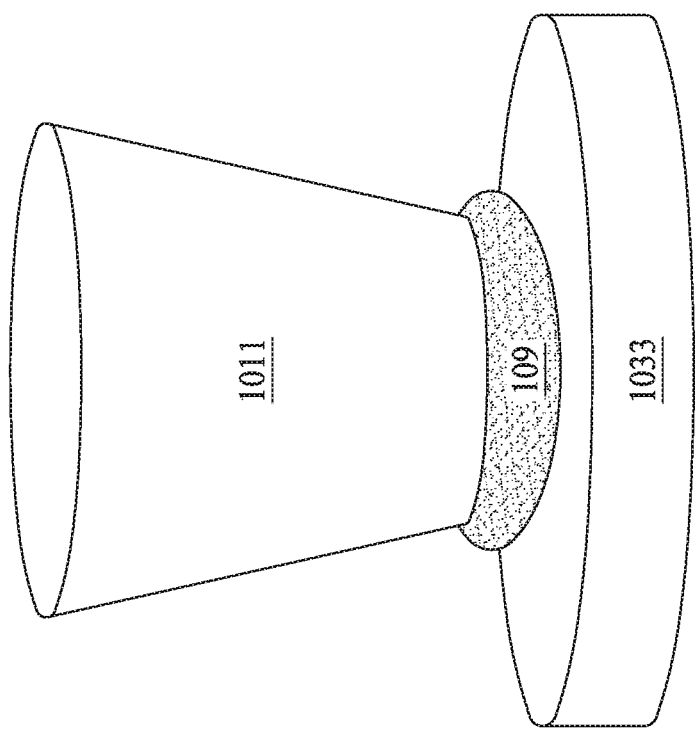
FIG. 6B shows a perspective view of a landing pad and an elongated hump over the landing pad, in accordance with some embodiments of the present disclosure.
Figure 6A:
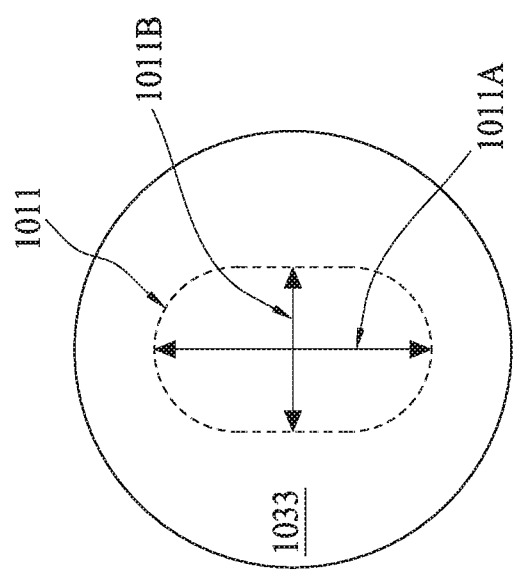
FIG. 6A shows a top view of a landing pad and a footprint of an elongated bump over the landing pad, in accordance with some embodiments of the present disclosure.

FIG. 6A shows a top view of a landing pad 1033 and a footprint of an elongated bump 1011 over the landing pad 1033. The footprint of the elongated bump 1011 is shown in dotted line, representing a shape of the bottom cross section of the elongated bump 1011. From the footprint of the elongated bump 1011, a long axis 1011A and a short axis 1011B can be identified. In some embodiments, the long axis 1011A and the short axis 1011B are mutually orthogonal. The elongated bump 1011 can be an oval shape, an ellipse shape, or any other geometry that is allowed to identify a long axis and a short axis.

FIG. 6B shows a perspective view of the landing pad 1033 and an elongated bump 1011 over the landing pad 1033. The landing pad 1033 and the elongated bump 1011 are electrically connected through solder 109. Note the elongated bump 1011 can have a tapered cone shape with elongated footprint. However, the elongated bump 1011 can be an elongated cylinder that has identical cross section throughout the height thereof. In some embodiments, the landing pad 1033 is a top metallization layer formed in a top-level inter-layer dielectric layer, which is a portion of conductive routes and has an exposed surface treated by a planarization process, such as a chemical mechanical polishing (CMP), if necessary. Suitable materials for the landing pad 1033 include, but are not limited to, for example copper, aluminum, copper alloy, or other mobile conductive materials, although it may also be formed of, or include, other materials, such as copper, silver, gold, nickel, tungsten, alloys thereof, and/or multi-layers thereof. The profile of the landing pad 1033 may have any suitable step height in order to achieve adequate bonding properties.

Figure 7B:
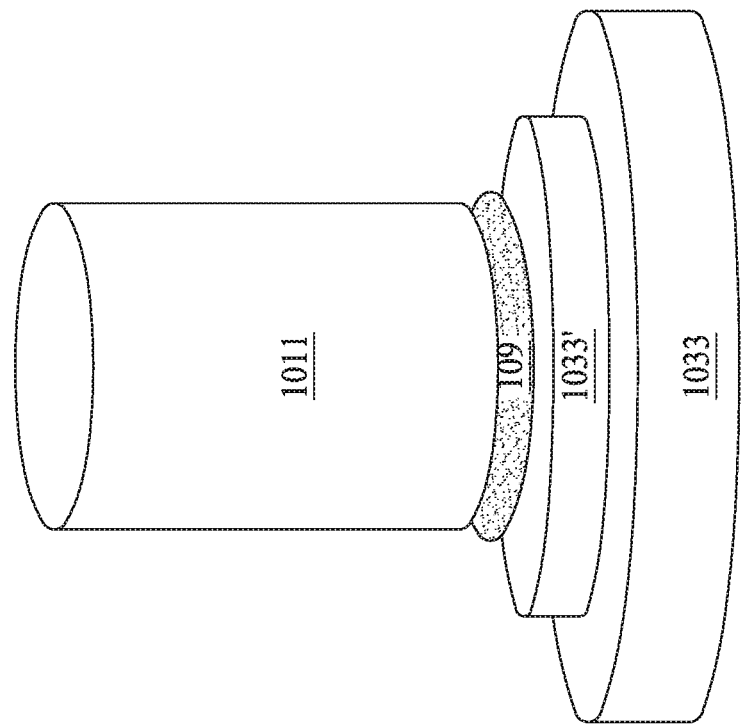
FIG. 7B shows a perspective view of a landing pad and an elongated bump over the landing pad, in accordance with some embodiments of the present disclosure.
Figure 7A:
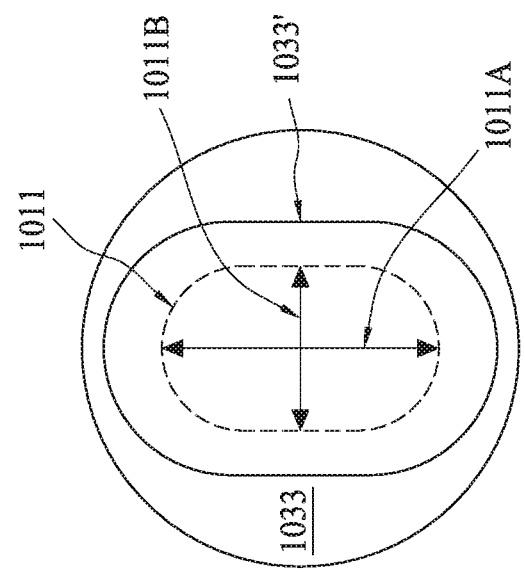
FIG. 7A shows a top view of a landing pad and a footprint of an elongated bump over the landing pad, in accordance with some embodiments of the present disclosure.

Numeral labels in FIG. 7A and FIG. 7B that are identical to those in FIG. 6A and FIG. 6B are referred to the same object or its equivalent, and are not repeated here for simplicity. Comparing FIGS. 6A, 6B and FIGS. 7A, 7B, an additional metal pad 1033' is positioned between the landing pad 1033 and the elongated bump 1011. The additional metal pad 1033' may have suitable thickness to better joint the landing pad 1033 and the elongated bump 1011. As process nodes continue to shrink, and as wafers are now being thinned to enable, for example, the use of through silicon vias (TSVs), additional problems with die warpage have been noticed. The additional metal pad 1033' can be used to prevent cold joint which is noticed to be a manufacturing problem derived from the die warpage. In some embodiments, the metal pad 1033' can have an elongated shape following the elongated bump 1011. However, the shape of the metal pad 1033' is not limited thereto, other geometries which could provide a sufficient height and area for receiving solder 109 and elongated bumps 1011 are within the contemplated scope of the present disclosure.

Figure 8:
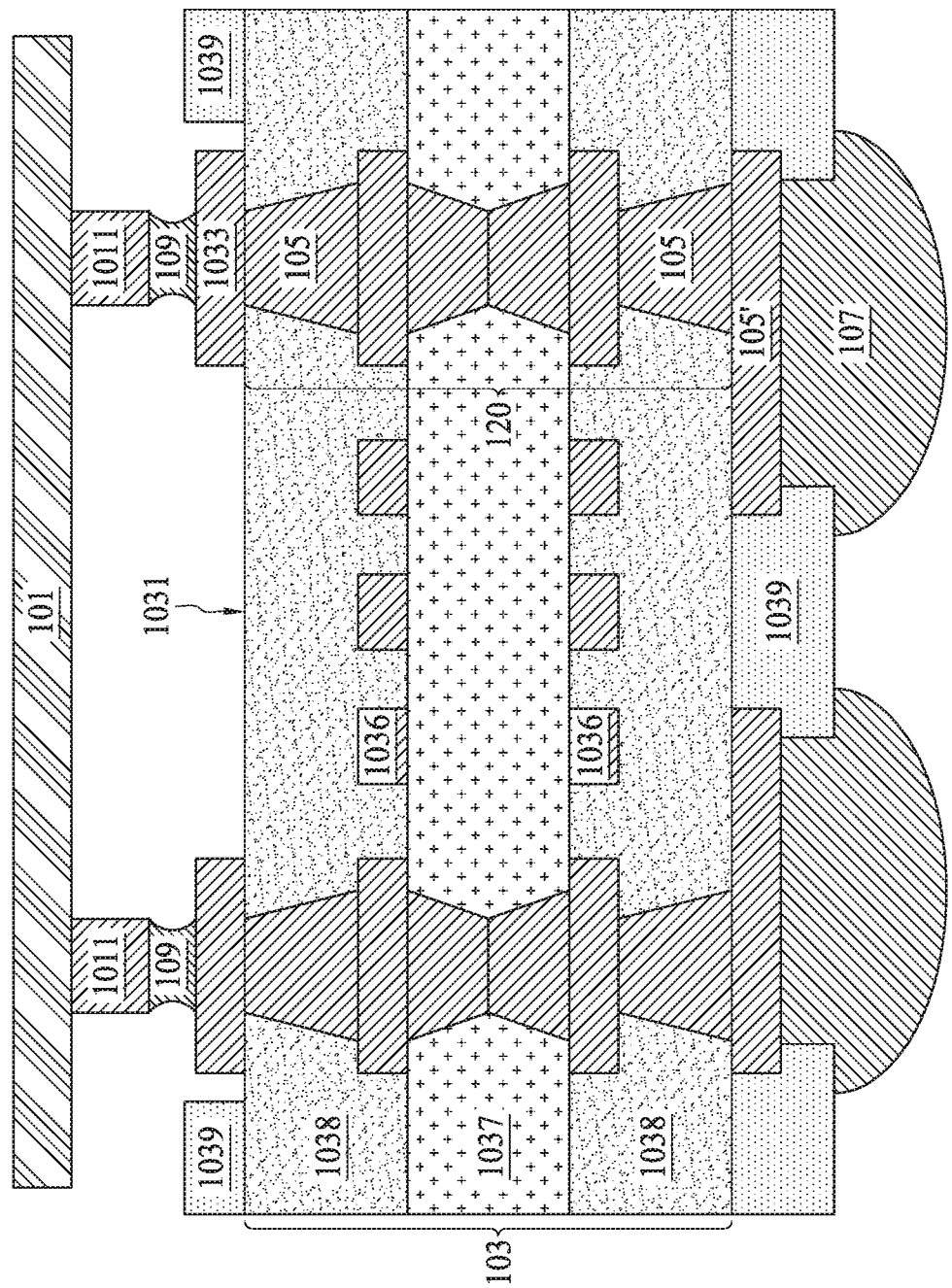
FIG. 8 shows a cross sectional view of a semiconductor flip chip package, in accordance with some embodiments of the present disclosure.

FIG. 8 to FIG. 11 shows different substrates that can be implemented in the semiconductor flip chip package of the present disclosure. Numeral labels in FIG. 8 to FIG. 11 that are identical to those in FIG. 1 are referred to the same object or its equivalent, and are not repeated here for simplicity. In FIG. 8, a semi-additive process substrate is used as a substrate 103 where the landing pads 1033 are positioned over the first surface 1031, electrically coupling with the elongated bump 1011 on an active surface of the semiconductor die 101. In some embodiments, a plurality of multi-level metallization layer 1036 are formed horizontally between the dielectric layers 1038, and laterally between two adjacent landing pads 1033 and a via structure 120 underneath each landing pads 1033. The via structure 120 in the substrate 103 discussed herein is referred to a vertical conductive path under the landing pads 1033. The metallization layout under the landing pads 1033 is designed to form a shortest conductive path connecting the landing pads 1033 to the external terminal 107, and hence the RC delay problem can be reduced. However, the design rule is to reduce total length of the conductive path connected to the landing pads 1033 given other design limitations. In some embodiments, the via structure 120 may include a horizontal wiring trace in one of the dielectric layer.

Figure 9:
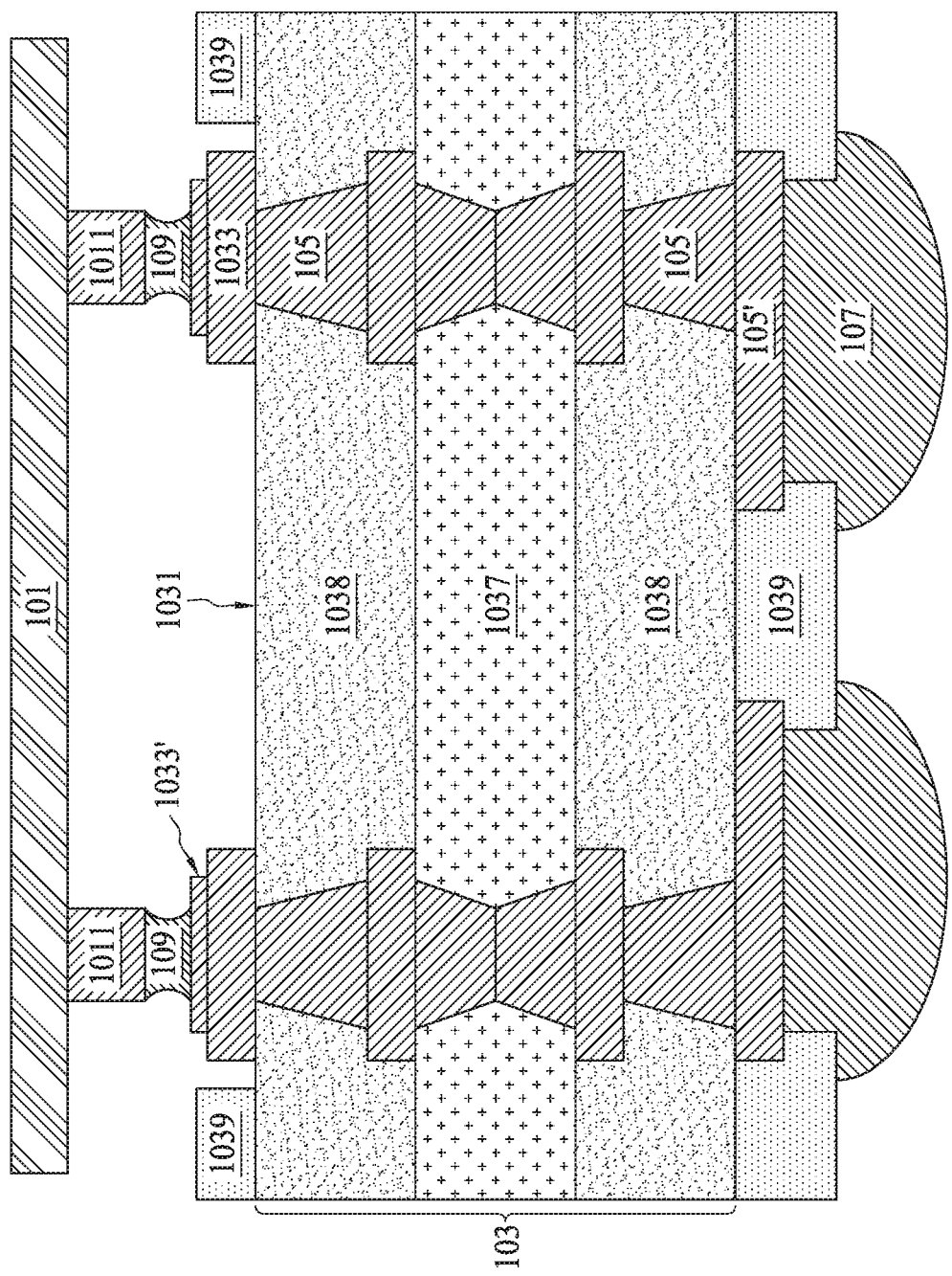
FIG. 9 shows a cross sectional view of a semiconductor flip chip package, in accordance with some embodiments of the present disclosure.
Figure 10:
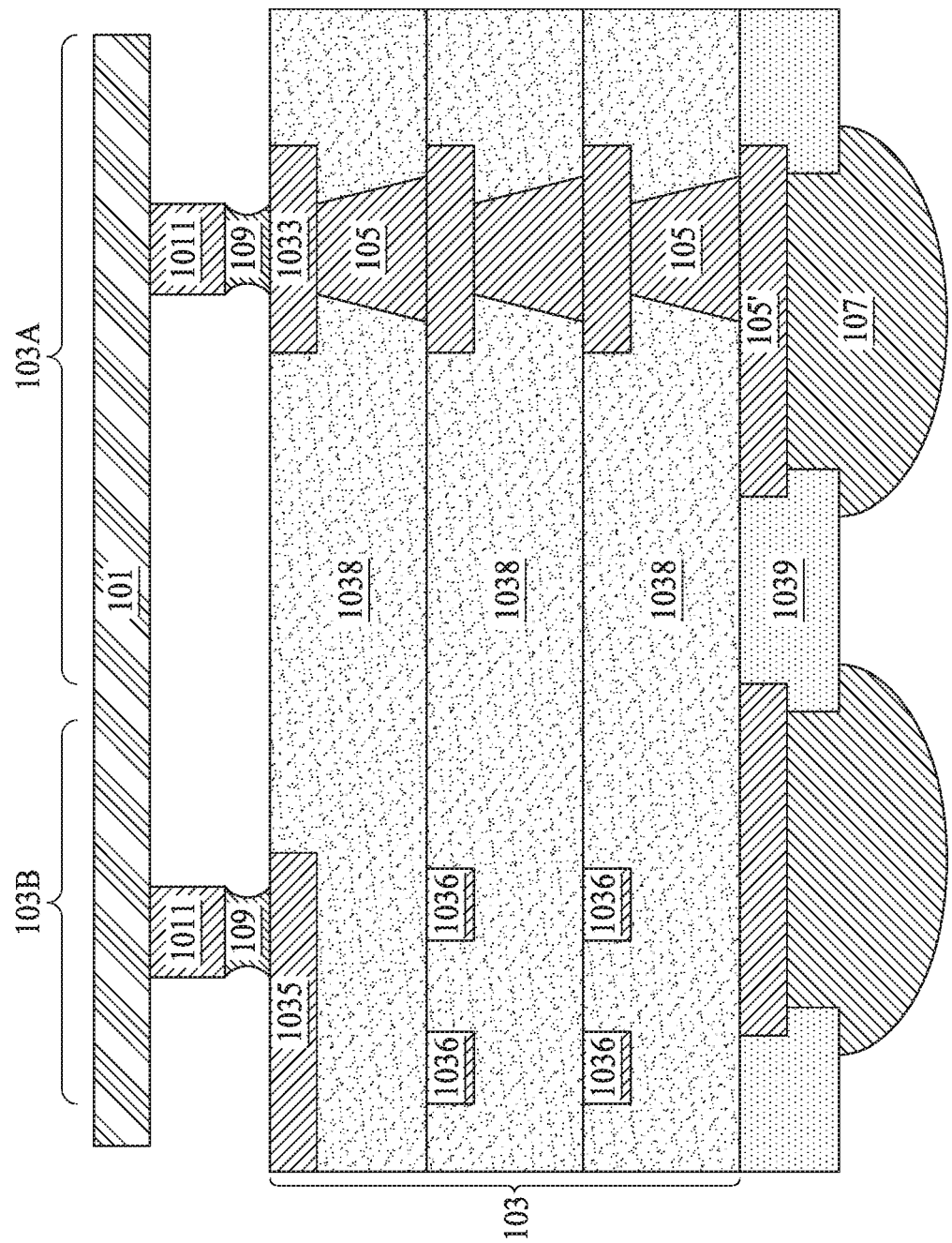
FIG. 10 shows a cross sectional view of a semiconductor flip chip package, in accordance with sonic embodiments of the present disclosure.
Figure 11:
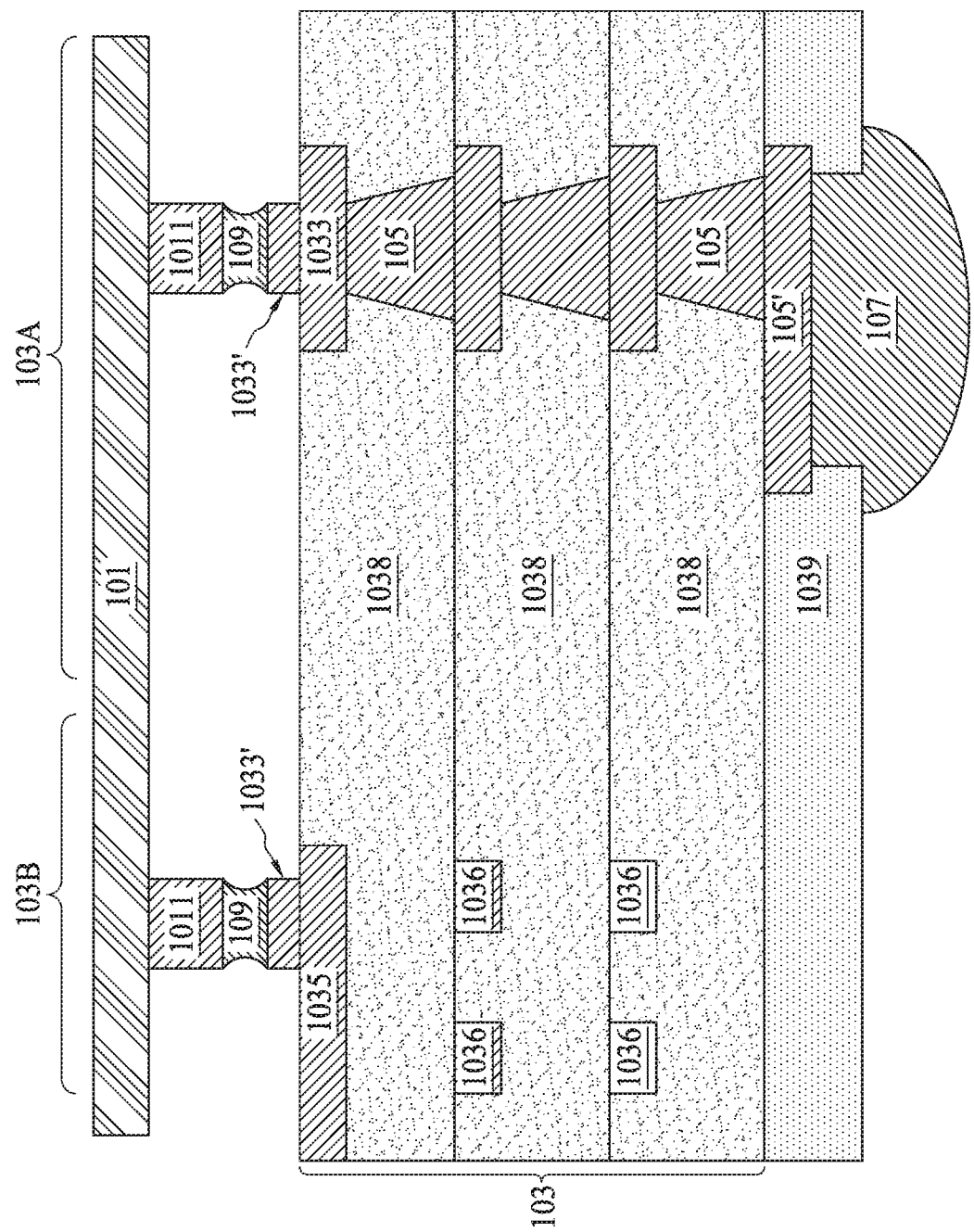
FIG. 11 shows a cross sectional view of a semiconductor flip chip package, in accordance with some embodiments of the present disclosure.

Referring to FIG. 9, an additional metal pad 1033' is positioned over the landing pads 1033 of the semi-additive process substrate. In FIG. 10, an embedded pattern plating substrate is used as a substrate 103 where the landing pads 1033 and landing traces 1035 are embedded under the first surface 1031 but a top surface of the landing pads 1033 and landing traces 1035 is exposed to receive the elongated bump 1011 on an active surface of the semiconductor die 101. In FIG. 10, a periphery region 10313 and a core region 103A of the substrate are parallel displayed. A via structure 120 is connected to the landing pads 1033 in the core region 103A whereas conductive trace wiring is connected to the landing trace 1035 in the periphery region 1039. In FIG. 11, an additional metal pad 1033' is positioned over the landing pads 1033 of the embedded pattern plating substrate. Note the core layer 1037 shown in the semiconductor-additive process substrate in FIG. 8 and FIG. 9 can be integrated in the embedded pattern plating substrate in FIG. 10 and FIG. 11.

Figure 12:
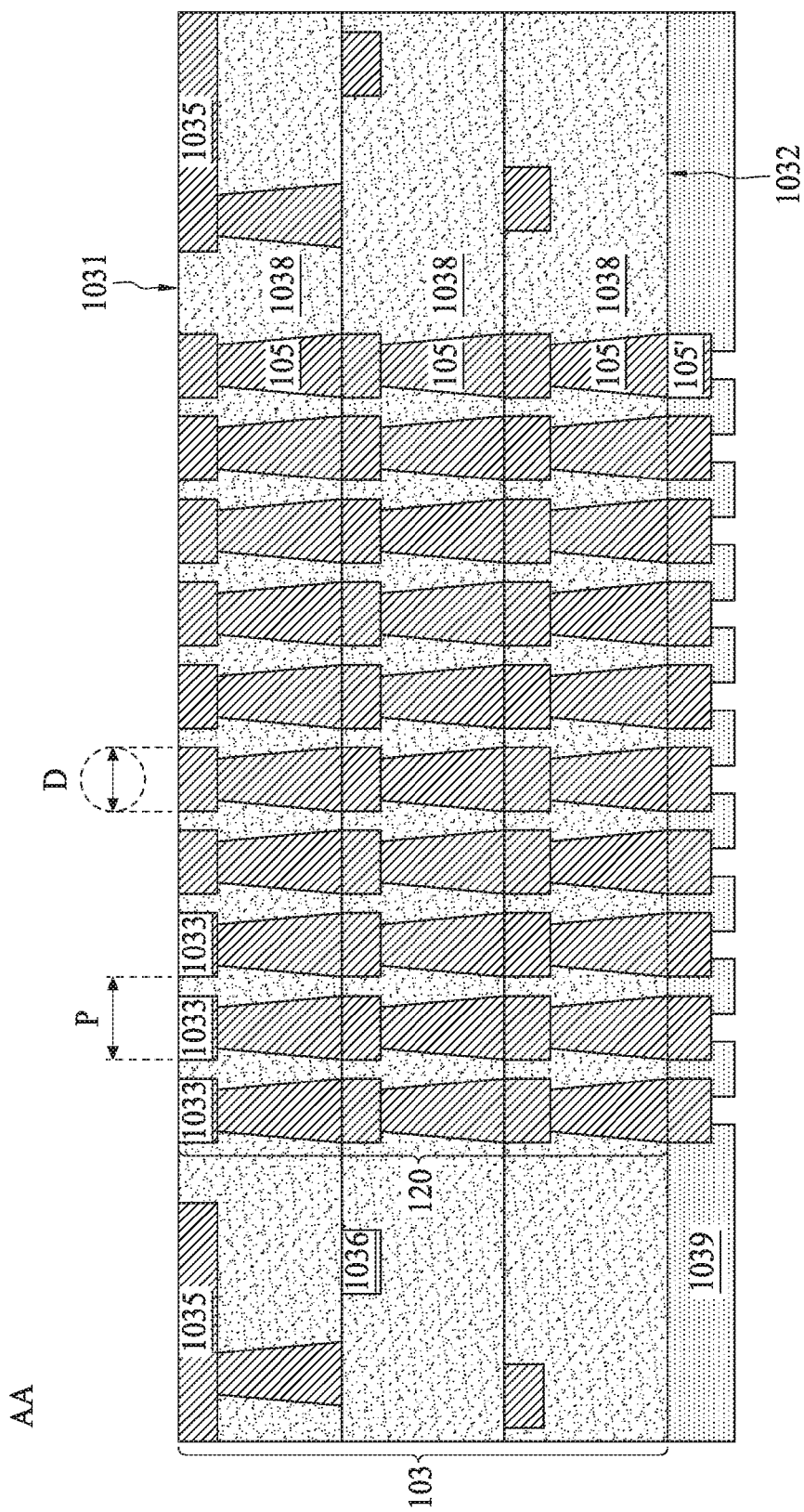
FIG. 12 to FIG. 16 are fragmental views of a method for manufacturing a semiconductor package, in accordance with some embodiments of the present disclosure.

FIG. 12 to FIG. 16 are fragmental views of a method for manufacturing a semiconductor package, for example having an embedded pattern plating substrate, in accordance with some embodiments of the present disclosure. FIG. 12 is a cross sectional view dissecting along line AA in FIG. 3. In FIG. 12, a plurality of landing pads 1033 are formed and exposed from the first surface 1031 of the substrate 103. In some embodiments, the landing pads 1033 are formed to have a circular surface, with a diameter of about 120 µm and below. A minimum pitch P of the landing pads 1033 is formed to he in a range from about 55 µm to about 280 µm. Note a via structure 120 discussed previously is formed in the multiple dielectric layer, connecting the landing pads 1033 to an external terminal (not shown in FIG. 12). A solder resist layer 1039 is formed on a second surface 1032 of the substrate 103, with a plurality of openings 120 to be receiving external terminals such as solder balls.

Figure 13:
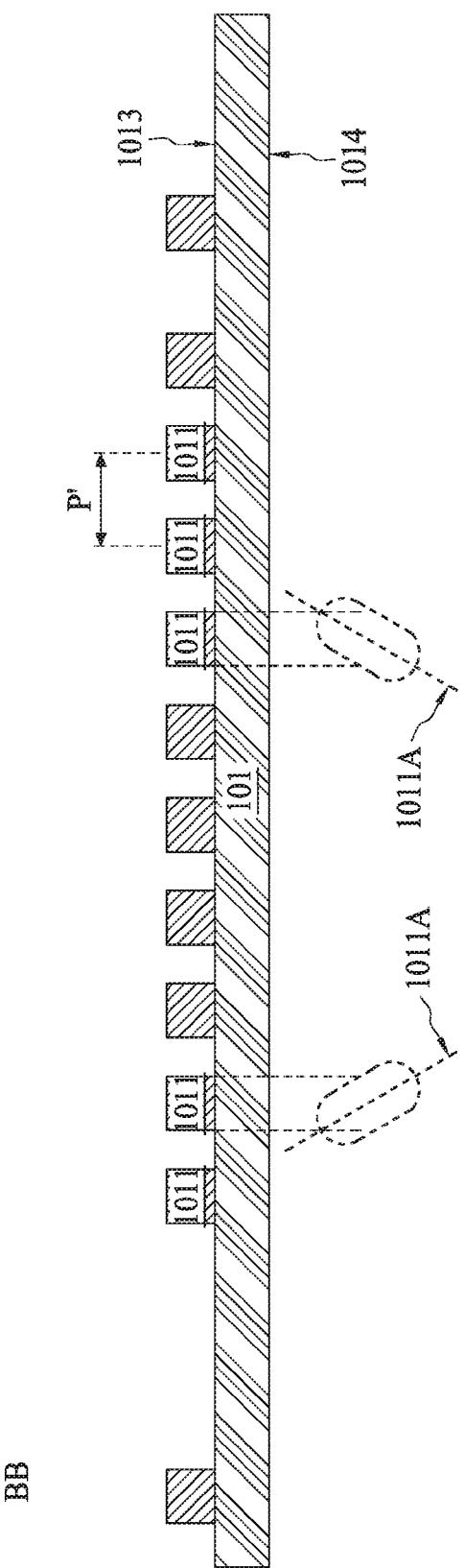

FIG. 13 is a cross sectional view dissecting along line BB in FIG. 4. In FIG. 13, a plurality of elongated bumps 1011 are formed on the third surface 1013, or an active surface, of the semiconductor die 101. In some embodiments, the elongated bumps 1011 are formed using suitable photolithography and electrical plating operation. The elongated bumps 1011 may include any suitable material. In some embodiments, the elongated bumps 1011 is a metal post, which may be formed of a conductive material with solder wettability. For example, the elongated bumps 1011 are formed of copper, which is referred to as a copper post (or copper bump). As shown in FIG. 13, the footprint of the elongated bump 1011 may include an oval shape or an eclipse shape. The footprint o the elongated bump 1011 has a short axis 1011B and a long axis 1011A as discussed in FIG. 6A and FIG. 7A. A pitch P' between adjacent elongated bumps 1011 is in a range of from about 55 µm in to about 280 µm, because the positions of the elongated bumps 1011 on the semiconductor die 101 is arranged accordingly to the positions of the landing pads 1033 on the substrate 103. The long axis 1011A of each elongated bumps 1011 can be directed to different direction, as shown in FIG. 13.

Figure 14:
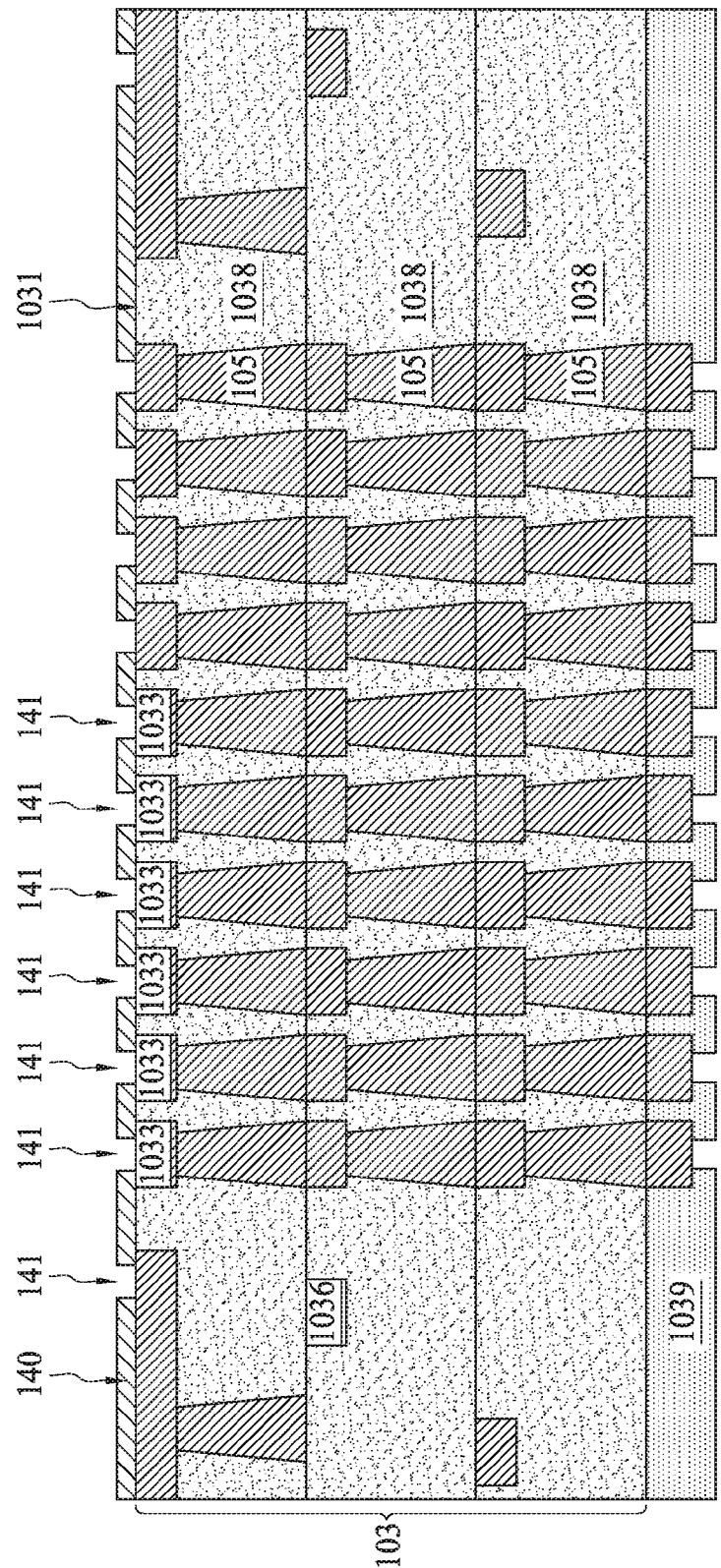
Figure 15:
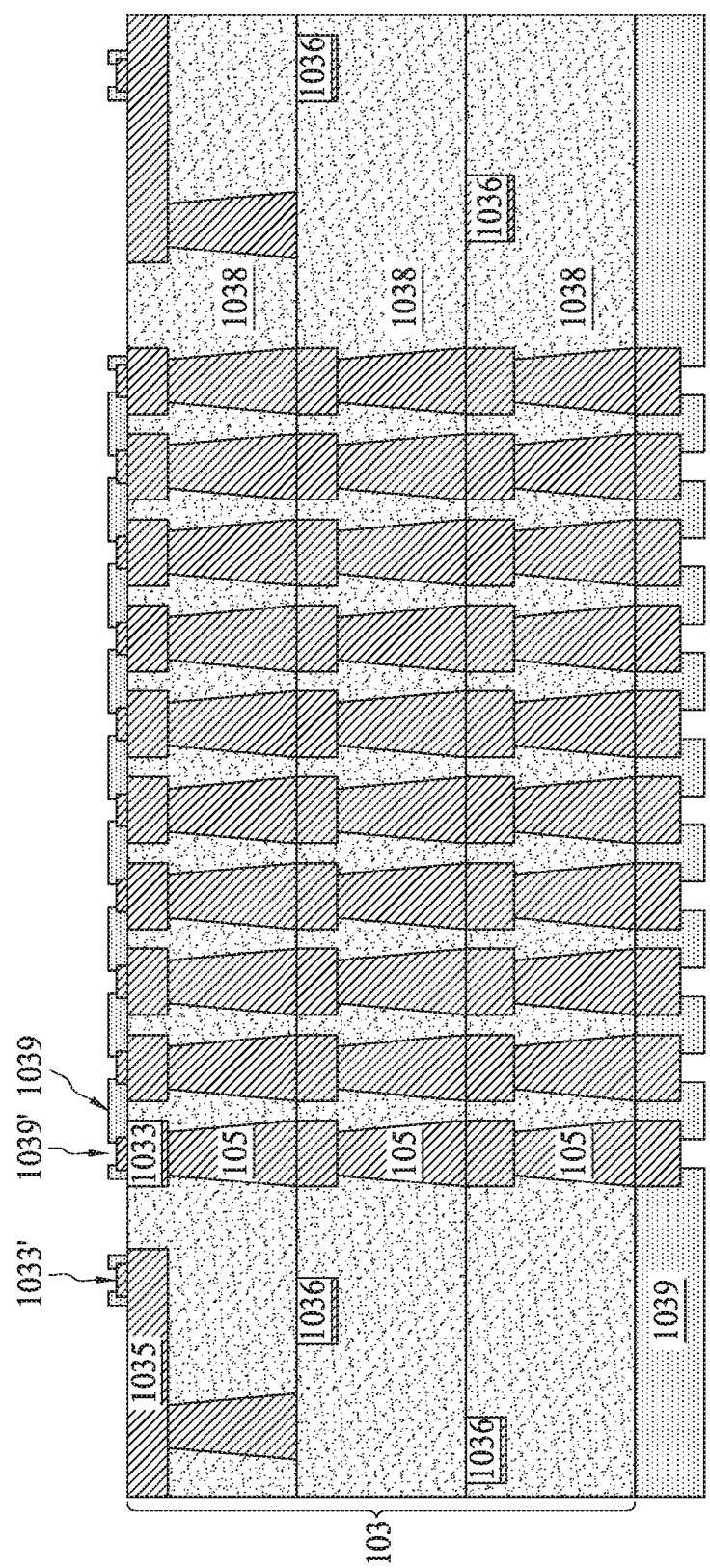

Referring to FIG. 14 and FIG. 15, an additional metal pad 1033' is formed on top of the landing pads 1033. In FIG. 14, a mask layer 140 is formed over the first surface 1031 of the substrate 103, and a plurality of openings 141 are formed in the mask layer 140, exposing a portion of the landing pads 1033. Suitable electrical plating or electroless plating operation can be performed to fill the openings 141, followed by a planarization operation and a lift off operation. In FIG. 15, solder resist 1039 may be formed over the landing pads 1033 and the metal pad 1033'. Solder resist openings 1039' are formed on first surface 1031 in proximity to a semiconductor die (not shown) to be joined. in some embodiments, a laser drill operation is performed on solder resist 1039 to form solder resist openings 1039'. In this non-limiting embodiment, this laser drilling operation may be performed before a pre-solder material (not shown) is disposed on the metal pads 1033'. Connections are made from the metal pads 1033' through an optional core layer and to a circuit board side in proximity to the external terminal of the substrate 103. These connections may be formed, for example, using a plated through-hole filled with a conductive plug. The metallization layers of the substrate may be formed using copper plating techniques, a seed layer may be electroless plated over a layer of the additive build up film or another dielectric.

Figure 16:
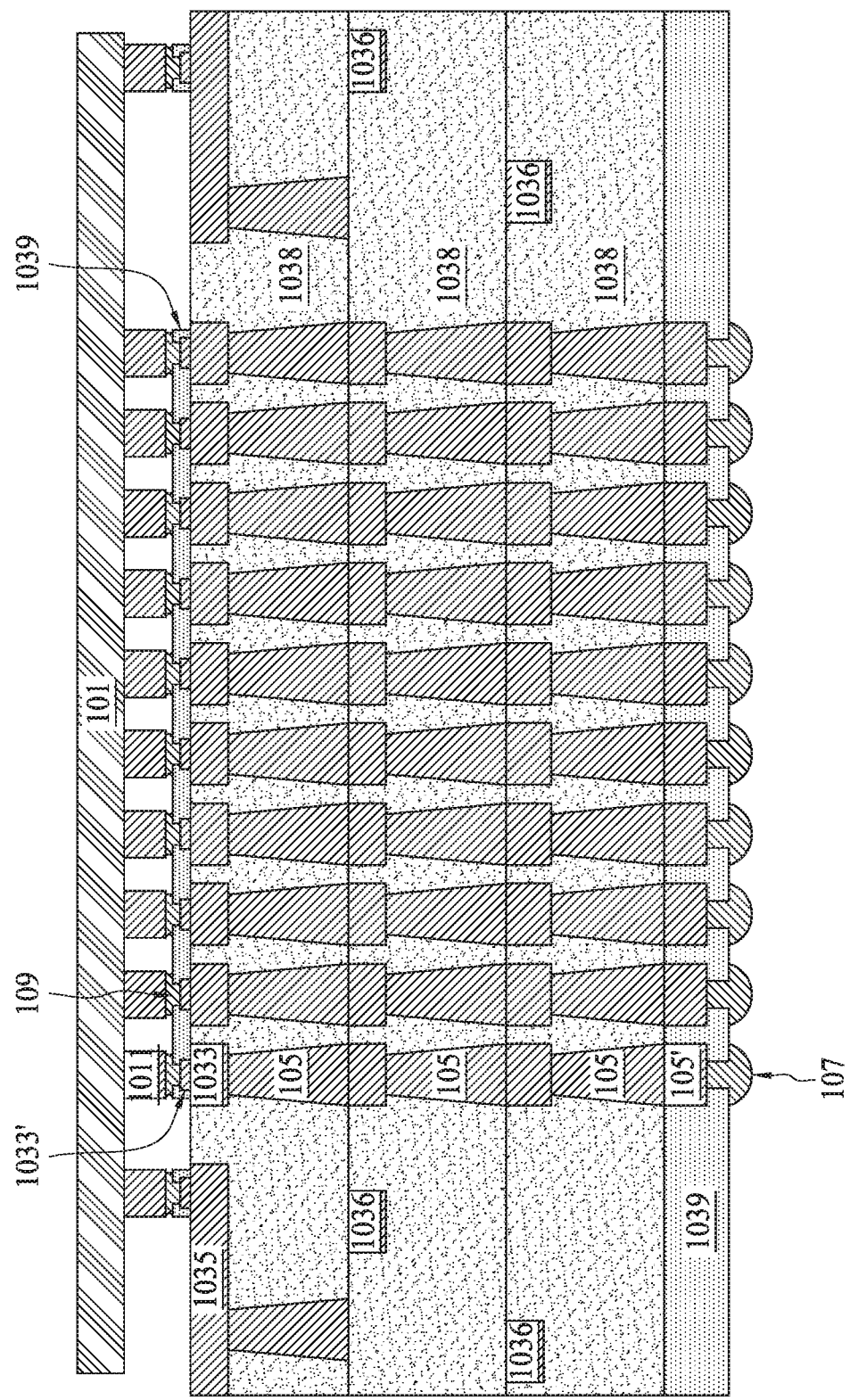

Referring to FIG. 16, semiconductor die shown in FIG. 13 is electrically coupled to the processed embedded pattern plating substrate shown in FIG. 15, for example, through a soldering operation and a reflow operation. The solder materials may include Sn, SnAg, SnPb, SnAgZn, SnZn, SnBiIn, SnIn, SnAu, SnPb, SnCu, SnZnIn, or SnAgSb, etc. In some embodiments, a flip chip integrated circuit die 101 may be mounted face down by aligning elongated bumps 1011 on the integrated circuit die 101 with corresponding landing pads 1033 and metal traces 1035, so that the solder and the pre-solder material are in contact. A chip attach operation is performed using a thermal reflow, the solder and pre-solder materials melt and then are allowed to cool, on reflowing they form the electrical and mechanical connections between the integrated circuit die 101 and the substrate 103.

Some embodiments of the present disclosure provide a semiconductor package, including a semiconductor die and a substrate having a first surface electrically coupled to the semiconductor die and a second surface opposing to the first surface. The first surface includes a core region having a plurality of landing pads and a periphery region surrounding the core region and having a plurality of landing traces. A pitch of the landing pads is from about 55 µm to about 280 µm.

In some embodiments, the semiconductor die includes a third surface facing the first surface of the substrate and a fourth surface opposing to the third surface. The third surface includes a plurality of elongated bump positioned correspondingly to the landing pads and the landing traces of the substrate, and the elongated bump includes a long axis and a short axis perpendicular to the long axis on a cross section thereof.

In some embodiments, a pitch of the elongated bumps positioned correspondingly to the core region of the first surface is from about 55 μm to about 280 μm.

In some embodiments, the periphery region of the first surface includes a width of about 6 times of a minimum pitch of the landing pads in the core region.

In some embodiments, the elongated bumps positioned correspondingly to the landing pads of the core region includes an I/O count density of from about 4000 ea/9*9 mm$^2$ to about 4500 ea/9*9 m$^2$.

In some embodiments, the long axes of the elongated bumps are directed to different directions.

In some embodiments, the third surface of the semiconductor die is an active surface.

In some embodiments, the second surface includes an external terminal.

Some embodiments of the present disclosure provide a semiconductor flip chip package, including a semiconductor die having a plurality of elongated bumps and a substrate having a plurality of landing pads and landing traces positioned correspondingly to the plurality of the elongated bumps. The substrate includes a core region with the landing pads thereon and a periphery region with the landing traces thereon. The landing pads are substantially circular.

In some embodiments, a pitch of the landing pads is from about 55 μm to about 280 μm.

In some embodiments, the substrate is a semi-additive process substrate, an embedded pattern plating substrate, or combinations thereof.

In some embodiments, the semiconductor package further includes a metal pad over the landing pads or landing traces of the semi-additive process substrate, the embedded pattern plating substrate, or the combinations thereof.

In some embodiments, the periphery region includes a width of about 6 times of a minimum pitch of the landing pads in the core region.

In some embodiments, the semiconductor package further includes solder between the landing pads and the elongated bumps.

In some embodiments, an electrical wiring in the substrate below the landing pads or the landing traces positioned correspondingly to the elongated bumps comprises a via structure.

Some embodiments of the present disclosure provide a method for manufacturing a semiconductor package, including (i) forming a plurality of landing pads in a core region of a substrate, the landing pads include a pitch of from 55 μm to about 280 μm, (ii) forming a plurality of elongated bumps on an active surface of a semiconductor die, and the elongated bumps are formed correspondingly to the plurality of the landing pads on the core region of the substrate, and (iii) electrically coupling the landing pads and the elongated bumps.

In some embodiments, the forming the plurality of landing pads includes forming a plurality of circular landing pads having a diameter less than 120 μm in the core region of the substrate.

In some embodiments, the forming the plurality of elongated bumps includes forming a plurality of elongated bumps with a long axis and a short axis perpendicular to the long axis on a cross section thereof, and the long axes are arranged to have different directions.

In some embodiments, the method for manufacturing a semiconductor package further includes forming a plurality of metal pads correspondingly positioned over the landing pads in the core region of the substrate.

In some embodiments, the electrically coupling the landing pads and the elongated bumps includes applying solder materials on the elongated bumps of the semiconductor die and reflowing the solder materials.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor die, comprising:
   an active surface configured to be coupled to a semiconductor substrate;
   a plurality of elongated bumps arranged in a center portion of the active surface; and
   a plurality of bumps arranged in a periphery portion of the active surface,
   wherein each of the plurality of elongated bumps comprises a short axis and a long axis, long axes of the plurality of elongated bumps are arranged in a radial pattern with respect to a center of the plurality of elongated bumps.

2. The semiconductor die of claim 1, wherein a pitch of the elongated bumps is from about 55 μm to about 280 μm.

3. The semiconductor die of claim 1, wherein the periphery portion of the active surface comprises a width of about 6 times of a minimum pitch of the elongated bumps in the core portion.

4. The semiconductor die of claim 1, wherein the elongated bumps of the core portion comprises an I/O count density of from about 4000 ea/9*9 mm$^2$ to about 4500 ea/9*9 mm$^2$.

5. The semiconductor die of claim 1, wherein the long axes of the elongated bumps are directed in two directions.

6. The semiconductor die of claim 1, wherein the plurality of bumps arranged in the periphery portion of the active surface comprises an elongated bump.

7. A semiconductor package, comprising:
   a semiconductor die having an active surface, the semiconductor die comprising:
   a plurality of first elongated bumps arranged in a center portion of the active surface; and
   a plurality of second elongated humps arranged in a periphery portion of the active surface,
   wherein each of the first plurality of elongated bumps comprises a short axis and a long axis, long axes of the plurality of first elongated bumps are arranged in a radial pattern with respect to a center of the plurality of first elongated bumps; and
   a substrate coupled to the active surface of the semiconductor die through the plurality of first elongated bumps and the plurality of second elongated bumps.

8. The semiconductor package of claim 7, wherein the substrate comprises a first surface coupling with the plurality of first elongated humps and the plurality of second elongated bumps, the first surface comprising:

a core region having a plurality of landing pads; and
a periphery region surrounding the core region and having a plurality of landing traces.

9. The semiconductor package of claim 8, wherein the plurality of first elongated humps is correspondingly connected with the plurality of landing pads.

10. The semiconductor package of claim 8, wherein the plurality of second elongated bumps is correspondingly connected with the plurality of landing traces.

11. The semiconductor package of claim 8, further comprising solder between the plurality of the landing pads and the plurality of first elongated bumps.

12. The semiconductor package of claim 7, wherein a pitch of the plurality of first elongated bumps is from about 55 μm to about 280 μm.

13. The semiconductor package of claim 12, wherein the periphery portion of the active surface comprises a width of about 6 times of the pitch of the plurality of first elongated bumps.

14. The semiconductor package of claim 7, wherein the substrate is a semi-additive process substrate, an embedded pattern plating substrate, or combinations thereof.

15. The semiconductor package of claim 14, wherein an electrical wiring in the substrate below the plurality of landing pads or the plurality of landing traces comprises a via structure.

16. A semiconductor flip chip package, comprising:
a semiconductor die comprising an active surface, a plurality of first elongated bumps arranged in a center portion of the active surface; and
a semiconductor substrate comprising a first surface facing the semiconductor die, a plurality of landing pads being arranged in correspondence to the plurality of first elongated bumps,
wherein each of the plurality of elongated bumps comprises a short axis and a long axis, long axes of the plurality of elongated bumps are arranged in a radial pattern with respect to a center of the plurality of elongated bumps.

17. The semiconductor flip chip package of claim 16, wherein the active surface further comprising a plurality of second elongated bumps arranged in a periphery portion surrounding the center portion.

18. The semiconductor flip chip package of claim 17, wherein the first surface further comprising a plurality of landing traces being arranged in correspondence to the plurality of second elongated bumps.

19. The semiconductor flip chip package of claim 16, wherein a pitch of the plurality of first elongated bumps is from about 55 μm to about 280 μm.

20. The semiconductor flip chip package of claim 19, wherein the periphery portion comprises a width of about 6 times of the pitch of the plurality of first elongated bumps.

* * * * *